(12) United States Patent
Jain et al.

(10) Patent No.: US 9,300,283 B1
(45) Date of Patent: Mar. 29, 2016

(54) SINGLE CAPACITOR, LOW LEAKAGE CHARGE PUMP

(71) Applicants: Mayank Jain, Ambala Cantt (IN); Sanjoy K. Dey, Noida (IN)

(72) Inventors: Mayank Jain, Ambala Cantt (IN); Sanjoy K. Dey, Noida (IN)

(73) Assignee: FREESCALE SEMICONDUCTOR,INC., Austin, TX (US)

( * ) Notice: Subject to any disclaimer, the term of this patent is extended or adjusted under 35 U.S.C. 154(b) by 0 days.

(21) Appl. No.: 14/624,587

(22) Filed: Feb. 18, 2015

(51) Int. Cl.
*G05F 1/10* (2006.01)
*H03K 5/134* (2014.01)
*H02M 3/07* (2006.01)
*H03K 5/00* (2006.01)

(52) U.S. Cl.
CPC ............... *H03K 5/134* (2014.07); *H02M 3/07* (2013.01); *H03K 2005/00293* (2013.01)

(58) Field of Classification Search
CPC ............ H02M 3/07; H02M 2003/071; H02M 2003/072; H02M 3/073; H02M 2003/075
See application file for complete search history.

(56) References Cited

U.S. PATENT DOCUMENTS

| 5,180,928 A * | 1/1993 | Choi ................... H02M 3/073 327/536 |
| 5,397,928 A | 3/1995 | Chan et al. |
| 5,546,296 A | 8/1996 | Savignac et al. |
| 5,552,747 A | 9/1996 | Tomasini et al. |
| 6,100,752 A * | 8/2000 | Lee ......................... H02M 3/07 327/536 |
| 6,486,726 B1 | 11/2002 | Worley, Sr. et al. |
| 6,816,000 B2 * | 11/2004 | Miyamitsu ............ H02M 3/073 327/536 |
| 7,215,179 B2 * | 5/2007 | Yamazoe ............... G11C 5/145 327/534 |
| 7,256,641 B2 * | 8/2007 | Namekawa ........... H02M 3/073 327/536 |
| 8,525,564 B2 | 9/2013 | Schober et al. |

OTHER PUBLICATIONS

Yoshinobu Nakagome et al., An Experimental 1.5-V 64-Mb DRAM, IEEE Journal of Solid-State Circuits, vol. 26, No. 4, Apr. 1991, pp. 465-472.
S. Basu and G.G. Temes, "Simplified clock voltage doubler", Electronic Letters Online No. 19991306, DOI, vol. 35, No. 22, Oct. 28, 1999, pp. 1901-1902.

* cited by examiner

*Primary Examiner* — Jeffrey Zweizig
(74) *Attorney, Agent, or Firm* — Charles E. Bergere

(57) ABSTRACT

A charge pump circuit includes a delay circuit, a transistor, and a capacitor. The charge pump receives an input signal and outputs an output signal. The delay circuit receives a first signal based on the input signal and outputs a first delayed signal. The transistor includes a gate, a first channel node, and a second channel node. The first channel node receives the first signal. The second channel node is connected to the output and to a first plate of the capacitor. A second plate of the capacitor receives a second signal based on the first delayed signal. The charge pump circuit is adapted to operate such that the voltage range of the output signal is greater than the voltage range of the input signal.

17 Claims, 8 Drawing Sheets

800

SINGLE CAPACITOR, LOW LEAKAGE CHARGE PUMP

BACKGROUND

The present invention relates to a charge pump circuit and, more particularly, to a single capacitor, low leakage charge pump circuit.

Lowering the supply voltage of an integrated circuit (IC) helps reduce the overall power requirements of the IC, which helps reduce costs in multiple ways. Some components of the IC may, however, in order to function properly, need voltage levels higher than the reduced supply voltage level. A charge pump is typically used to generate such higher voltage levels from the available supply voltage level. Conventional charge pumps use a switching means to charge a flying capacitor and then discharge the flying capacitor to a reservoir capacitor to provide a doubled or inverted output voltage. The use of multiple capacitors and/or switches requires a significant amount of the IC's real estate. Thus, it would be advantageous to reduce the amount of real estate of a charge pump circuit.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not drawn to scale.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment, an IC has a charge pump circuit that uses one capacitor, a transistor, and appropriately connected delay circuitry to generate a signal having a higher peak voltage value than the input signal. In another embodiment, an IC has a charge pump circuit that uses one capacitor, a transistor, and appropriately connected delay circuitry to output, from a non-negative input signal, a signal having a negative peak voltage value. As explained below, just one capacitor is used as both a flywheel and a reservoir capacitor. The use of only one capacitor helps reduce the size of the charge pump circuit.

Figure 1:
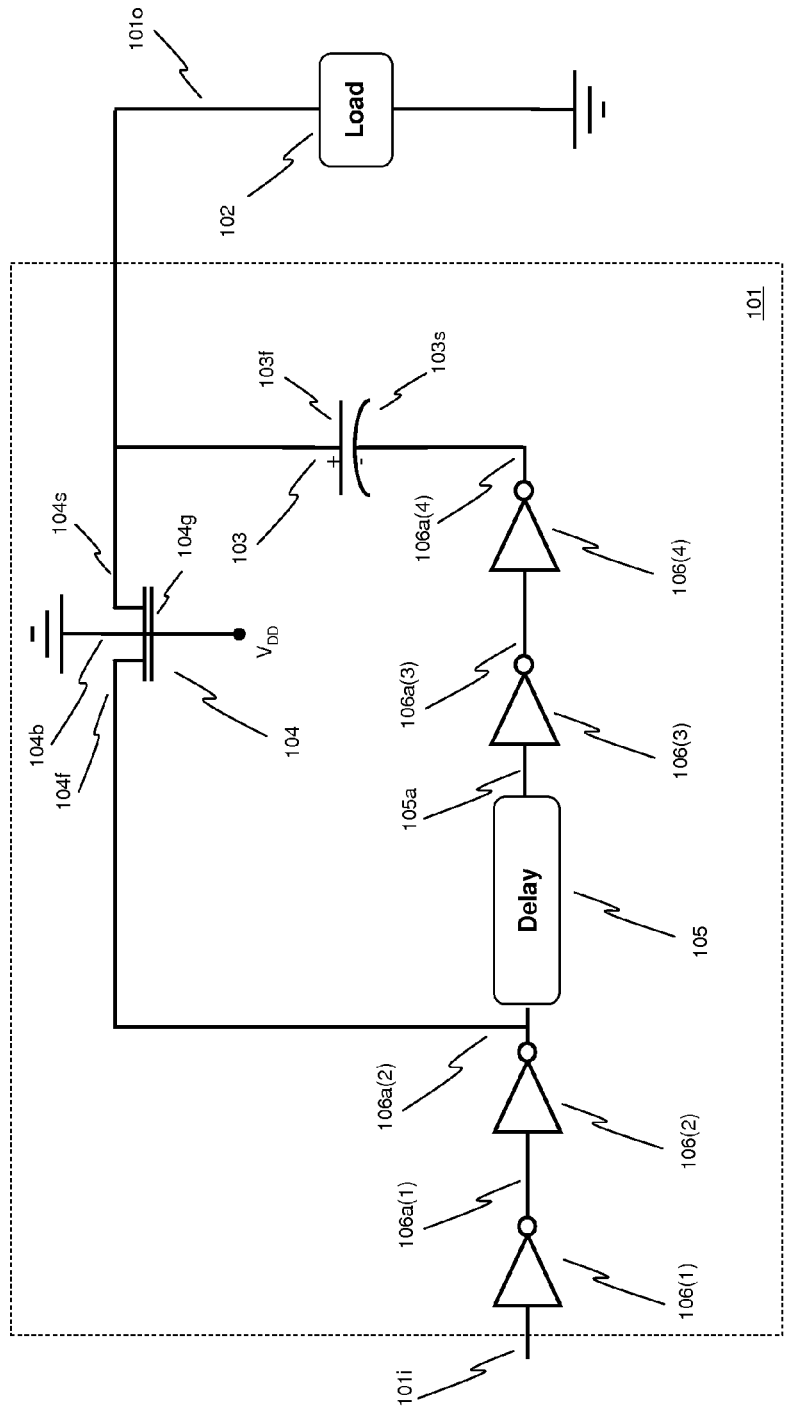
FIG. 1 is a schematic circuit diagram of a charge pump circuit in accordance with one embodiment of the present invention.

Referring now to FIG. 1, is a simplified schematic circuit diagram of a charge pump circuit 101 in accordance with one embodiment of the present invention is shown. The charge pump circuit 101 is connected to a load 102. The charge pump circuit 101 provides to the load 102 an output signal 101o whose voltage amplitude is approximately double that of an input signal 101i that is provided to the charge pump circuit 101. The charge pump circuit 101 comprises a capacitor 103, a field-effect transistor (FET) 104, a delay circuit 105, and a plurality of inverters 106(1)-106(4).

The input signal 101i is provided to the inverter 106(1), whose output 106a(1) is provided to the inverter 106(2). The inverter 106(2) provides its output 106a(2) to a first channel node 104f of the NMOS (N-channel Metal-Oxide Semiconductor) transistor 104 and the delay circuit 105. The channel nodes of a FET are the source and the drain terminals. Since the designations of the source and drain terminals of a FET may vary as the FET's operating parameters vary, these two terminals are collectively referred to herein as the channel nodes. The second channel node 104s of the FET 104 is connected to (i) a first plate 103f of the capacitor 103 and (ii) an input of the load 102.

The load 102 may include, for example, the gate terminal of another FET (not shown), in which case the load 102 may be viewed as a capacitive load. The gate 104g of the FET 104 is connected to a supply voltage $V_{DD}$. The body 104b—in other words, the p-well—of the FET 104 is connected to a common reference voltage, e.g., ground.

The delay circuit 105 may be an asymmetrical delay circuit, which provides different delays for signal transitions on the signal 106a(2) depending on whether the signal 106a(2) transitions up (i.e., has an uptick from low to high) or down (i.e., has a downtick from high to low). For example, the delay applied by the delay circuit 105 may be longer for upticks than for downticks. The asymmetrical delay circuit 105 may be implemented using a series of CMOS (complementary MOS) skewed inverters (not shown). A CMOS inverter comprises a PMOS transistor and a complementary NMOS transistor. A CMOS skewed inverter may achieve its asymmetrical delays by, for example, having different channel widths for its respective constituent PMOS and NMOS transistors. Note that, in some alternative embodiments, the charge pump circuit may, instead, use a symmetrical delay circuit.

The delay circuit 105 provides an output signal 105a to the inverter 106(3). The inverter 106(3) provides its output 106a(3) to the inverter 106(4). The inverter 106(4) provides its output 106a(4) to a second plate 103s of the capacitor 103.

Figure 2:
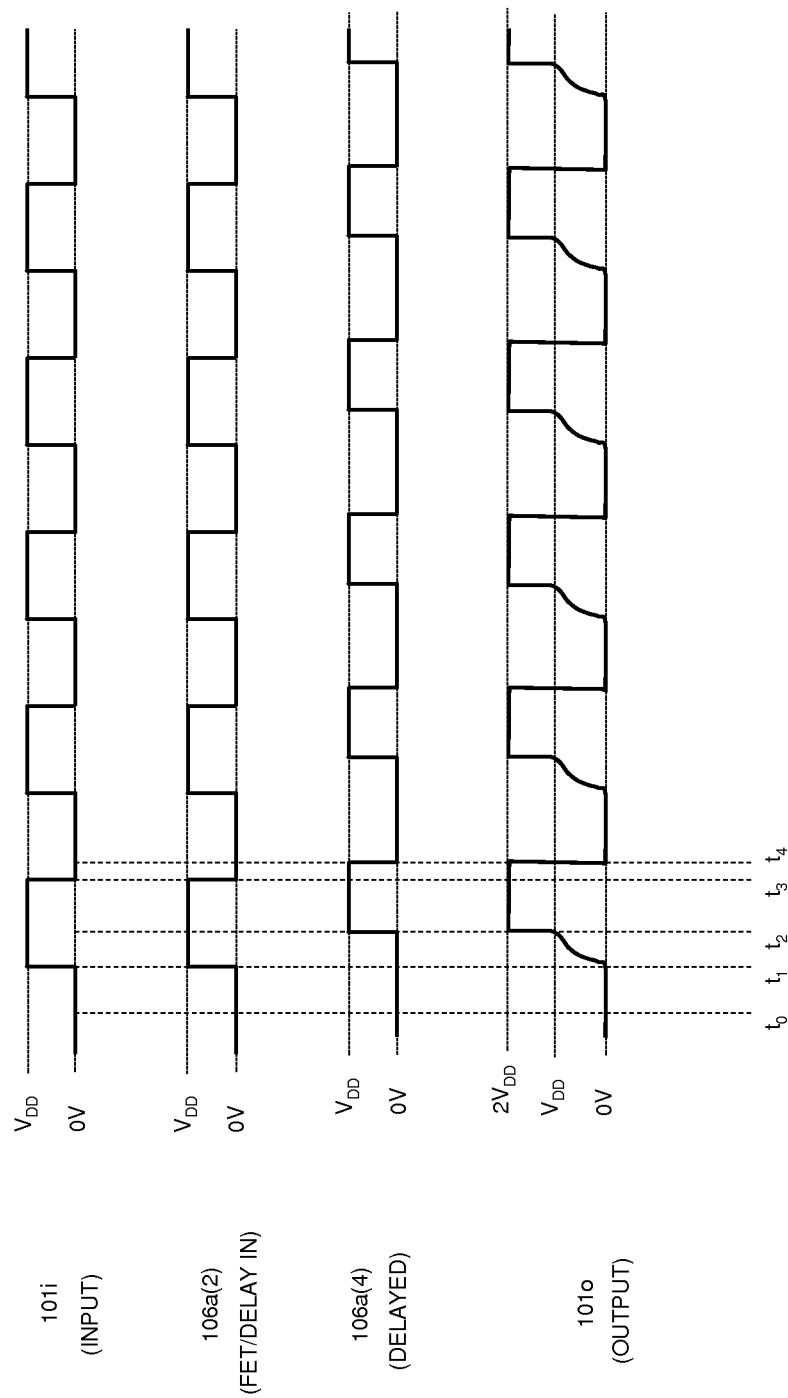
FIG. 2 is a timing diagram for selected signals of the charge pump circuit of FIG. 1.

FIG. 2 is a timing diagram 200 for selected signals of the charge pump circuit 101 of FIG. 1. The timing diagram 200 includes plots for the input signal 101i, the FET input signal 106a(2), the delayed signal 106a(4), and the output signal 101o. The input signal 101i is a periodic square wave, such as a clock signal.

At time to, the four above-noted signals are at ground (i.e., 0 volts). The first channel node 104f of the FET 104 functions as the source terminal of the FET 104. Since the gate 104g is at $V_{DD}$ and the source 104f is at 0 volts, FET 104 is on, and the output 101o follows the input signal 101i and is therefore at 0 volts.

At time $t_1$, the input signal 101i goes to $V_{DD}$ and the FET input signal 106a(2) follows substantially without delay. In other words, any delays that may be introduced by inverters 106(1)-106(2) are negligible. The first channel node 104f of the FET 104 now functions as the drain and is at $V_{DD}$, while the second channel node 104s now functions as the source with the output signal 101o starting at 0 volts. The FET 104 remains on and allows for the gradual charging of the first plate 103f of the capacitor 103, while the second plate 103s of the capacitor 103 remains at 0 volts. This is demonstrated by the delayed signal 106a(4) remaining at 0 volts and the voltage level of the output signal 101o rising between times $t_1$ and $t_2$. Depending on various parameters—such as the uptick delay implemented by the delay circuit 105 and the inverters 106(3) and 106(4), which determines the interval between the times $t_1$ and $t_2$—the output 101o may rise up to $V_{DD}$.

At time $t_2$, after the uptick delay, the delayed signal 106a(4) goes to $V_{DD}$ which brings the second plate 103s of the capacitor 103 up to $V_{DD}$. As a result, the voltage of the first plate 103f of the capacitor 103 goes up by $V_{DD}$, consequently raising the output 101o by $V_{DD}$. Depending on the particular parameters of the components involved, the peak voltage value of the output 101o may rise up to a level between $V_{DD}$ and $2*V_{DD}$. In some implementations, the output 101o rises to at least $1.5*V_{DD}$. The higher peak voltage value of the output 101o is then available for use by the load 102.

At this time, the gate-to-source voltage of the FET 104 is non-positive and, as a result, the FET 104 turns off, and the combination of the second channel node 104s—now functioning as the source—and the body 104b functions similarly to a reverse-biased diode, keeping the first plate 103f from discharging through transistor 104. Leakage current across transistor 104 may be minimized because the gate-to-source voltage between the gate 104g and the first channel node 104f is 0, and the source-to-body voltage between the first channel node 104f and the body 104b is $V_{DD}$.

At time $t_3$, the input 101i returns to 0 volts, and the FET input signal 106a(2) soon follows. Then, at time $t_4$, after a downtick delay that is shorter than the uptick delay, the delayed signal 106a(4) returns to 0 volts. In some implementations, the downtick delay is less than half of the uptick delay. In some of these implementations, the downtick delay is not more than one quarter of the uptick delay. Having a sufficiently long uptick delay allows for a full charging of the capacitor 103. Having a sufficiently short downtick delay allows for a faster switch-off time for the output 101o, which may be useful for the load 102. At time $t_4$, transistor 104 is on again, since the gate-to-source voltage is at $V_{DD}$, and so the output signal 101o follows the input signal 101i and drops to 0 volts.

Figure 3:
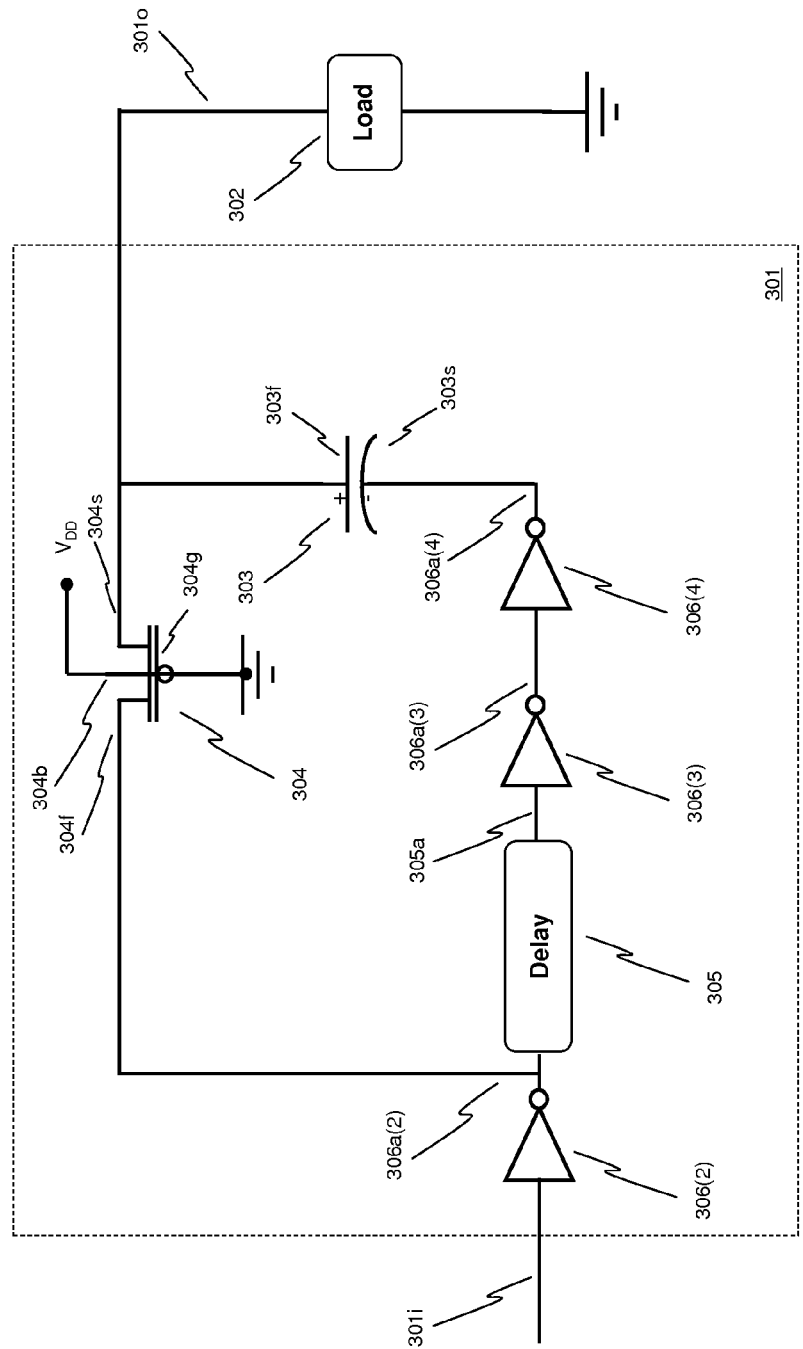
FIG. 3 is a schematic circuit diagram of a negative charge pump circuit in accordance with another embodiment of the present invention.

FIG. 3 is a simplified schematic circuit diagram of a negative charge pump circuit 301 in accordance with another embodiment of the present invention, where the negative charge pump circuit 301 is connected to a load 302. The negative charge pump circuit 301 provides to the load 302 an output signal 301o whose amplitude may be below the common reference voltage and near $-V_{DD}$ for part of its cycle. The negative charge pump circuit 301 comprises a capacitor 303, a transistor 304, a delay circuit 305, and a plurality of inverters 306(2)-306(4). The negative charge pump circuit 301 is similar in many ways to the charge pump circuit 101 of FIG. 1 and corresponding elements are similarly numbered but with a different prefix. Note, however, that negative charge pump circuit 301 uses a PMOS transistor instead of an NMOS transistor and provides an inverted input signal to its delay circuitry. Descriptions of elements of the charge pump circuit 101 apply, with any necessary adjustments—as would be appreciated by a person of ordinary skill in the art, to the corresponding elements of the negative charge pump circuit 301.

The inverter 306a(2) receives the input signal 301i and outputs an inverse input signal 306a(2). The first channel node 304f of the PMOS FET 304 receives the inverse input signal 306a(2), which is also provided to the delay circuit 305. The gate 304g of the transistor 304 is connected to the common reference voltage, e.g., ground or 0 volts. The body 304b—in other words, the n-well—of the transistor 304 is connected to the supply voltage $V_{DD}$. The second channel node 304s of the transistor 304 is connected to the first plate 303f of the capacitor 303 and an input of the load 302. The delay circuit 305 may provide a longer delay for downticks than for upticks.

Figure 4:
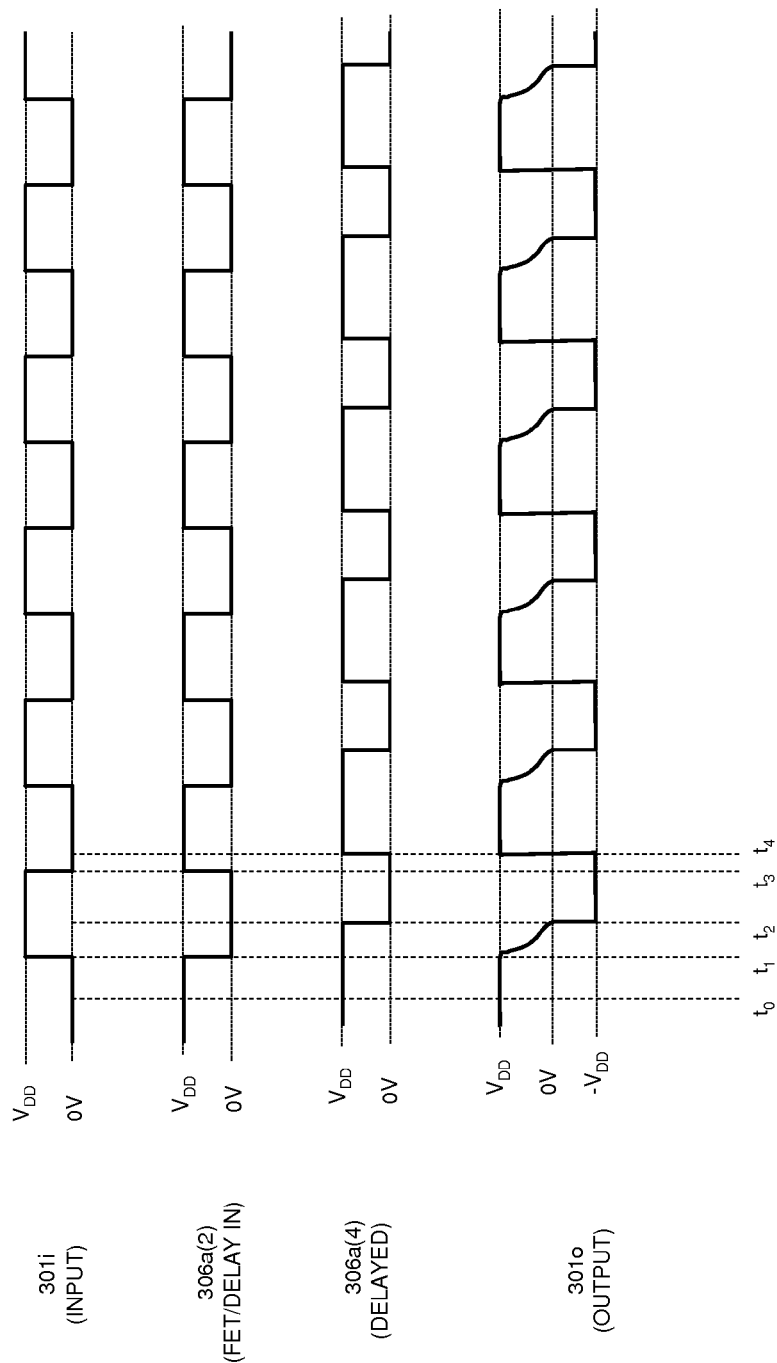
FIG. 4 is a timing diagram for selected signals of the negative charge pump circuit of FIG. 3.

FIG. 4 is a timing diagram 400 for selected signals of the negative charge pump circuit 301 of FIG. 3. The timing diagram 400 includes plots for the input signal 301i, the FET input signal 306a(2), the delayed signal 306a(4), and the output signal 301o.

At time to, the input 301i is at 0 volts, and the other signals in the timing diagram 400 are at $V_{DD}$. The first channel node 304f of the FET 304 functions as the source of the FET 304. Since the gate 304g is at 0 volts and the source 304f is at the supply voltage $V_{DD}$, PMOS FET 304 is on, and the output 301o follows the FET input 306a(2) and is, consequently, at $V_{DD}$.

At time $t_1$, the input signal 301i goes to $V_{DD}$ and the FET input signal 306a(2), which is the inverse of the input signal 301i, goes from $V_{DD}$ to 0 volts substantially without delay. The first channel node 304f of the FET 304 now functions as the drain and is at 0 volts, while the second channel node 304s, which is at $V_{DD}$, now functions as the source. The FET 304 remains on and allows for the gradual discharging of the first plate 303f of the capacitor 303. This is demonstrated by the output signal 301o dropping between times $t_1$ and $t_2$. Depending on the downtick delay implemented by delay circuit 305, which determines the interval between the times $t_1$ and $t_2$, the output signal 301o may fall down to 0 volts.

At time $t_2$, after the downtick delay, the delayed signal 306a(4) goes to 0 volts and drops the voltage of the second plate 303s of the capacitor 303 down from $V_{DD}$ to 0 volts. As a result, the voltage of the first plate 303f of the capacitor 103 drops by $V_{DD}$, consequently lowering the output 301o by $V_{DD}$. Depending on the particular parameters of the components involved, the output 301o may drop down to a level between 0 volts and $-V_{DD}$. In some implementations, the output 301o may drop to a level at least below $-0.5V_{DD}$.

At this time, the gate-to-source voltage of FET 304 is non-negative and, consequently, FET 304 turns off and the combination of the body 304b and the second channel node 304s—now functioning as the source—functions similarly to a reverse-biased diode. Leakage current across the transistor 304 may be minimized because the gate-to-source voltage between the gate 304g and the first channel node 304f is 0 volts, and the source-to-body voltage between the first channel node 304f and the body 304b is $-V_{DD}$.

At time $t_3$, the input signal 301$i$ goes to 0 volts, and the FET input signal 306$a$(2) follows inversely, going to $V_{DD}$. Then, at time $t_4$, after an uptick delay that is shorter than the downtick delay, the delayed signal 306$a$(4) goes to $V_{DD}$. At time $t_4$, the transistor 304 is on again, since the gate-to-source voltage is at $-V_{DD}$, and so the output signal 301$o$ follows the FET input signal 306$a$(2) and goes up to $V_{DD}$. As can be seen from timing diagrams 200 and 400, the range—i.e., variation in voltage level—of each output signal 101$o$ and 301$o$ is greater than the range of the corresponding input signal 101$i$ and 301$i$.

Figure 5:
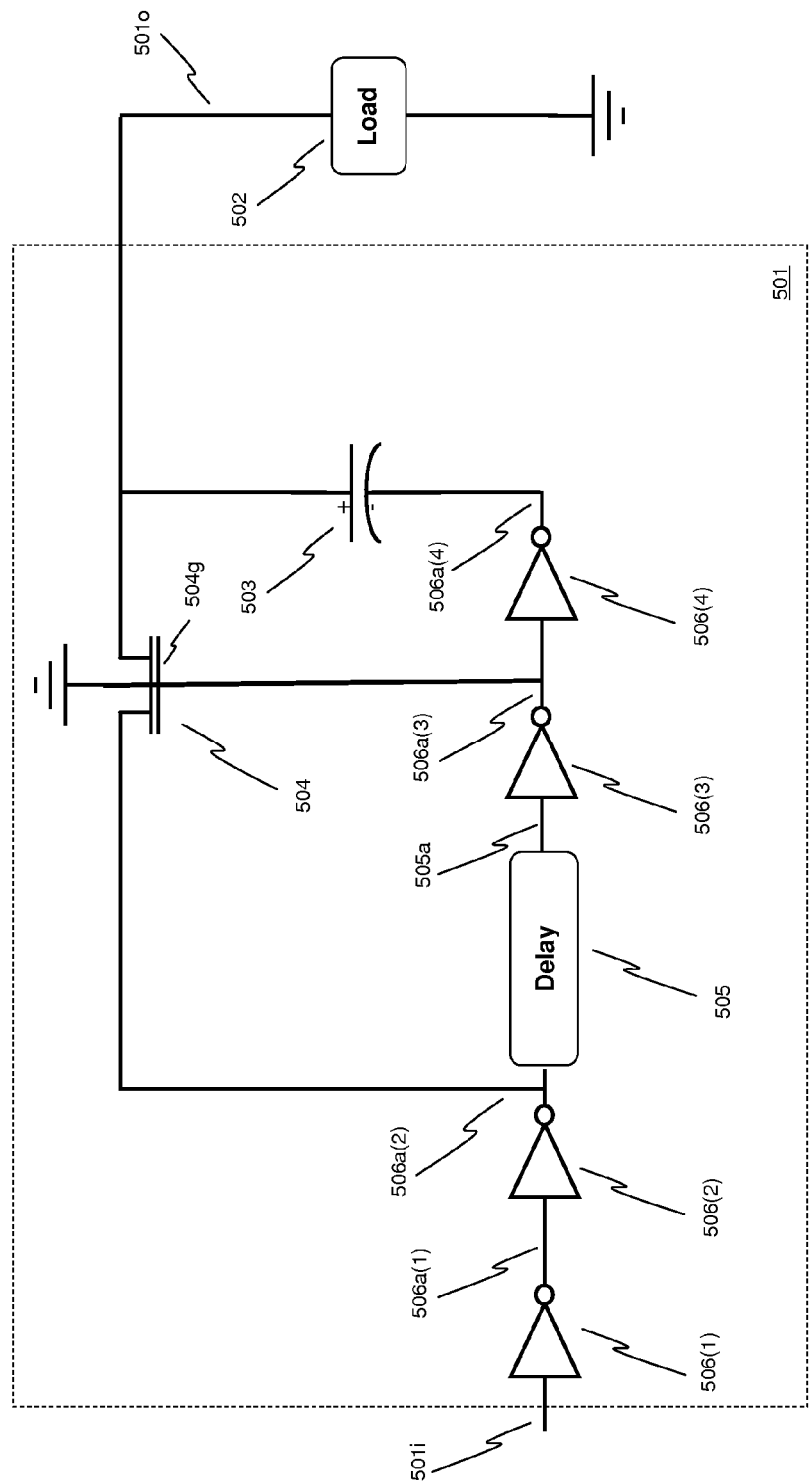
FIG. 5 is a schematic circuit diagram of an alternative implementation of the charge pump circuit of FIG. 1.

FIG. 5 is a simplified schematic circuit diagram of an alternative implementation 501 of the charge pump circuit 101 of FIG. 1. Similar components such as, for example, the NMOS transistor 504, are similarly labeled but with a different prefix. In charge pump circuit 501, the gate 504$g$ of the transistor 504 is connected to the output 506$a$(3) of the inverter 506(3), rather than to the supply voltage $V_{DD}$.

Figure 6:
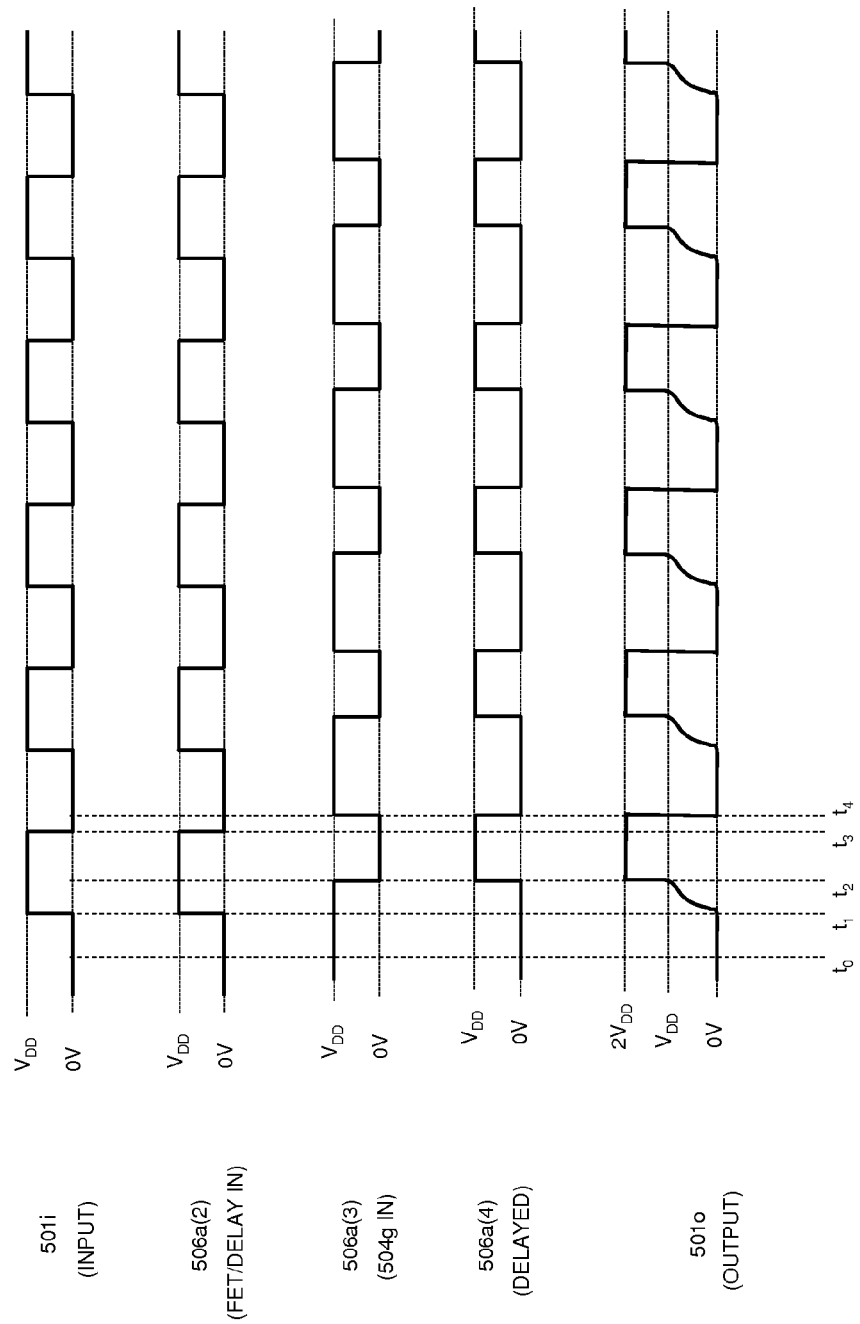
FIG. 6 is a timing diagram for selected signals of the charge pump circuit of FIG. 5.

FIG. 6 is a timing diagram 600 for selected signals of the charge pump circuit 501 of FIG. 5, which includes the gate input signal 506$a$(3). The charge pump circuit 501 operates in substantially the same way as described above for the charge pump circuit 101, except that the voltage provided to the gate 504$g$ of the transistor 504 is at 0 volts for a portion of each cycle rather than continuously staying at $V_{DD}$. The lower voltage on the gate 504$g$ makes for a more-negative gate-to-source voltage, which reduces the leakage current through the transistor 504 during corresponding time periods. However, the lower voltage on the gate 504$g$—and the corresponding greater voltage differentials—may require having a higher voltage rating for the transistor 504 than for the transistor 104 of the charge pump circuit 101 of FIG. 1. Higher-rated transistors are typically more costly than otherwise-similar lower-rated transistors.

Figure 7:
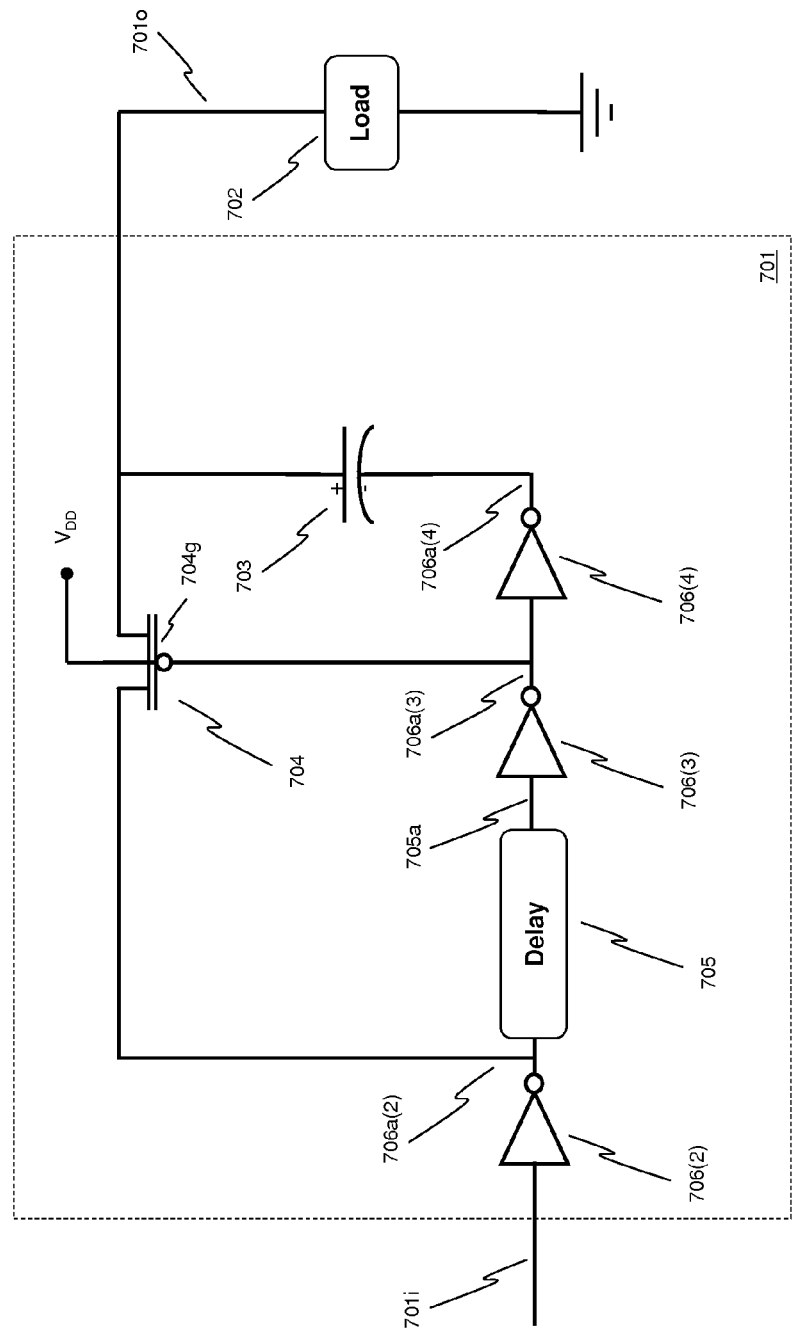
FIG. 7 is a schematic circuit diagram of an alternative implementation of the charge pump circuit of FIG. 3.

FIG. 7 is a simplified schematic circuit diagram of an alternative implementation 701 of the charge pump circuit 301 of FIG. 3. Similar components such as, for example, the PMOS transistor 704, are similarly labeled but with a different prefix. In the charge pump circuit 701, the gate 704$g$ of the transistor 704 is connected to the output 706$a$(3) of the inverter 706(3), rather than to the common reference voltage.

Figure 8:
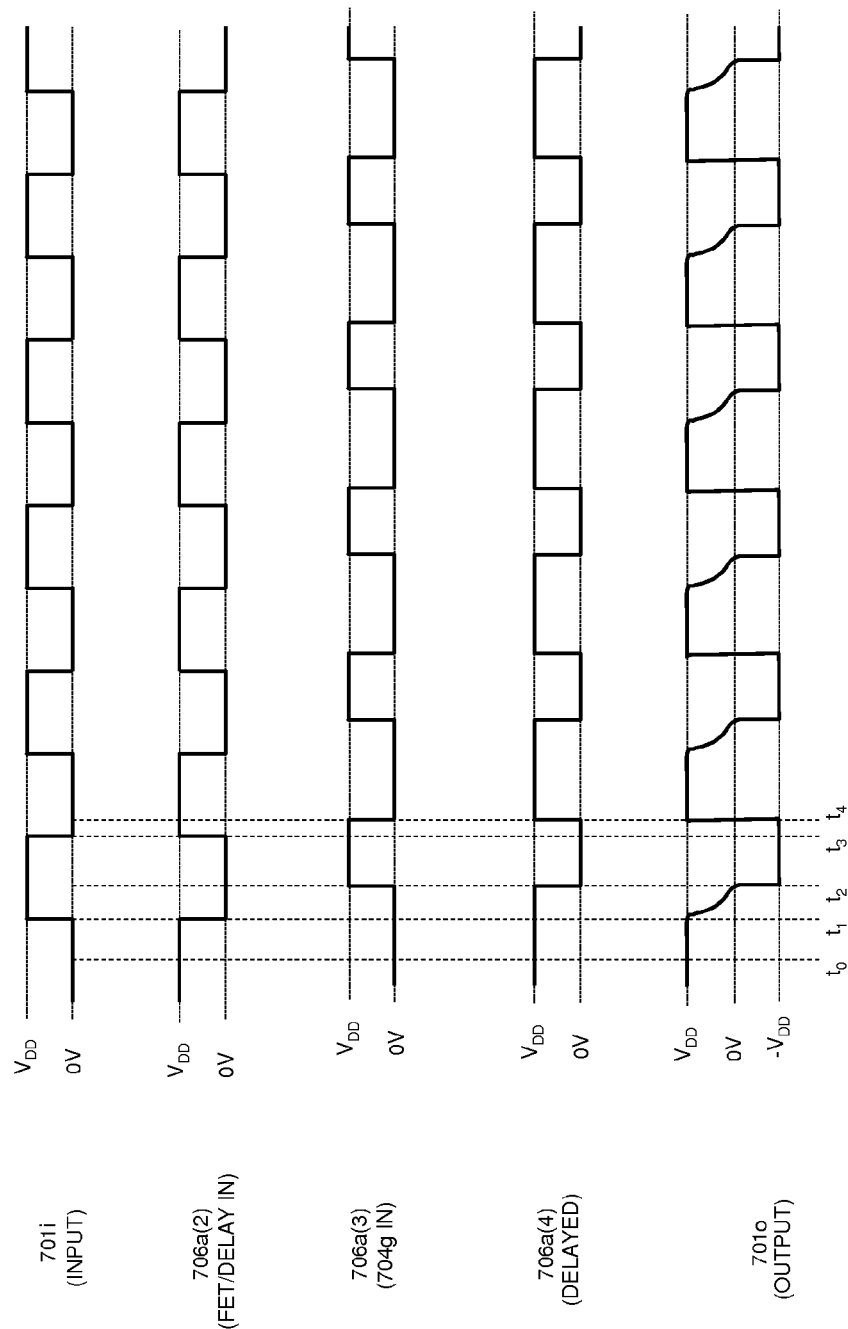
FIG. 8 is a timing diagram for selected signals of the charge pump circuit of FIG. 7.

FIG. 8 is a timing diagram 800 for selected signals of the charge pump circuit 701 of FIG. 7, which includes the gate input signal 706$a$(3). The charge pump circuit 701 operates in substantially the same way as the charge pump circuit 301, except that the voltage provided to the gate 704$g$ of the transistor 704 is at $V_{DD}$ for a portion of each cycle rather than continuously staying at 0 volts. The higher voltage—i.e., $V_{DD}$—on the gate 704$g$ makes for a more-positive gate-source voltage, which reduces the leakage current through the transistor 704 during corresponding time periods. However, the higher voltage on the gate 704$g$—and the corresponding greater voltage differential—may require having a higher voltage rating for the transistor 704 than for the transistor 304 of the charge pump circuit 301 of FIG. 3. As noted above, higher-rated transistors are typically more costly than otherwise-similar lower-rated transistors.

If voltages higher than $2*V_{DD}$ are desired, then a plurality of the charge pumps 101 and/or 501 may be connected in series to provide such voltages. If voltages lower than $-V_{DD}$ are desired, then a plurality of the charge pumps 301 and/or 701 may be connected in series to provide such voltages. It should be noted that later stages of the connected charge pumps may require higher-rated components than earlier stages to handle the larger voltage ranges.

Embodiments of the invention have been shown where the capacitor used is shown as a polarized capacitor. The invention is not, however, so limited. Any suitable capacitor—polarized or not—may be used.

Embodiments of the invention have been described where the capacitor is described as having two plates. It should be noted that the plates may be of any suitable shape and are not restricted to planar surfaces. In other words, the plates may be curved, spiral, cylindrical, or in any other suitable shape.

Embodiments of a positive charge pump have been described where the input signal passes through two inverters before being provided to the FET and the delay circuit. The invention is not, however, so limited. In some alternative implementations, the input signal to the charge pump circuit goes directly to the FET and the delay circuit without first passing through any inverters.

Embodiments of the invention have been described where the output of the delay circuit passes through a pair of inverters before being provided to the second plate of the capacitor. The invention is not, however, so limited. In some alternative implementations, the output of the delay circuit is provided directly to the second plate of the capacitor without passing through any intermediary inverters.

Embodiments of the invention have been described where the input signal is a periodic square wave. However, the invention is not so limited. Any suitable variable-voltage signal may be used as an input signal.

Embodiments of the invention have been described where the transistor is a FET. In alternative embodiments, the charge pump circuit may use a different type of transistor such as, for example, a bipolar junction transistor (BJT).

It will be further understood that various changes in the details, materials, and arrangements of the parts which have been described and illustrated in order to explain the nature of this invention may be made by those skilled in the art without departing from the scope of the invention as expressed in the following claims.

For purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a field-effect transistor (FET) device (also referred to as a metal-oxide semiconductor FET (MOSFET)), the term "channel" refers to the path through the device between the source and the drain. Similarly, as used in the claims, the terms "source," "drain," and "gate" should be understood to refer either to the source, drain, and gate of a MOSFET or to the emitter, collector, and base of a bi-polar junction transistor (BJT) device when an embodiment of the invention is implemented using BJT technology.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The invention claimed is:

1. An integrated circuit (IC) comprising a charge pump circuit that receives an input signal at an input node and provides an output signal at an output node, the charge pump circuit comprising:
    a delay circuit that receives a first signal based on the input signal and outputs a delayed signal;
    a transistor comprising a gate, a first channel node, and a second channel node; and
    a capacitor, wherein:
        the first channel node receives the first signal;
        the second channel node is connected to the output node and to a first plate of the capacitor; and
        a second plate of the capacitor receives a second signal based on the delayed signal, wherein:
    the first signal is substantially an inverse of the input signal;
    the second signal is substantially identical to the delayed signal;
    the input signal is non-negative; and
    the lowest voltage value of the output signal is negative.

2. The IC of claim 1, wherein the charge pump circuit comprises exactly one capacitor.

3. The IC of claim 1, wherein:
    and
    the output signal has a peak voltage value that is higher than the peak voltage value of the input signal.

4. The IC of claim 3, wherein the transistor is an N-channel metal-oxide semiconductor (NMOS) field-effect transistor (FET).

5. The IC of claim 4, wherein:
    the transistor further comprises a body; and
    the body is held at a ground voltage.

6. The IC of claim 4, wherein the gate is held at a supply voltage of the charge pump circuit.

7. The IC of claim 4, wherein the charge pump circuit further comprises:
    a first inverter that receives the delayed signal and outputs an inverted delayed signal; and
    a second inverter that receives the inverted delayed signal and outputs the second signal, and
    wherein the gate receives the inverted delayed signal.

8. The IC of claim 1, wherein the transistor is a P-channel metal-oxide semiconductor (PMOS) FET.

9. The IC of claim 8, wherein:
    the transistor further comprises a body;
    the body is held at a supply voltage of the charge pump circuit.

10. The IC of claim 8, wherein the gate is held at a ground voltage.

11. The IC of claim 8, wherein the charge pump circuit further comprises:
    a first inverter that receives the delayed signal and outputs an inverted delayed signal;
    a second inverter that receives the inverted delayed signal and outputs the second signal, and
    wherein the gate receives the inverted delayed signal.

12. The IC of claim 1, wherein the input signal is a periodic square wave having upticks and downticks.

13. The IC of claim 12, wherein the delay circuit is an asymmetric delay circuit that introduces a first delay period for upticks and a second delay period, different from the first delay period, for downticks.

14. The IC of claim 13, wherein the shorter of the first and second delay periods is not longer than half of the longer of the first and second delay periods.

15. The IC of claim 13, wherein the shorter of the first and second delay periods is not longer than a quarter of the longer of the first and second delay periods.

16. The IC of claim 1, further comprising a set of one or more additional charge pump circuits connected in series, the set having a set input node that is connected to the output node.

17. A charge pump circuit that receives an input signal at an input node and provides an output signal at an output node, the charge pump circuit comprising:
    a delay circuit that receives a first signal based on the input signal and outputs a delayed signal;
    a transistor comprising a gate, a first channel node that receives the first signal, and a second channel node connected to the output node; and
    a single capacitor having a first plate connected to the second channel node and the output node, and a second plate that receives a second signal based on the delayed signal, wherein the charge pump circuit comprises exactly one capacitor.

* * * * *